United States Patent
Ruffieux

(10) Patent No.: US 7,339,854 B2
(45) Date of Patent: Mar. 4, 2008

(54) CLOCK GENERATOR

(75) Inventor: David Ruffieux, Lugnorre (CH)

(73) Assignee: CSEM Centre Suisse d'Electronique et de Microtechique SA, Recherche et Developpement, Neuchatel (CH)

( * ) Notice: Subject to any disclaimer, the term of this patent is extended or adjusted under 35 U.S.C. 154(b) by 79 days.

(21) Appl. No.: 10/548,806

(22) PCT Filed: Mar. 3, 2004

(86) PCT No.: PCT/CH2004/000121

§ 371 (c)(1),
(2), (4) Date: May 23, 2006

(87) PCT Pub. No.: WO2004/082141

PCT Pub. Date: Sep. 23, 2004

(65) Prior Publication Data

US 2006/0214701 A1    Sep. 28, 2006

(30) Foreign Application Priority Data

Mar. 13, 2003  (FR) .................................. 03 03111

(51) Int. Cl.
*G04F 5/00* (2006.01)
*G04F 1/04* (2006.01)
*G06F 1/04* (2006.01)
*G06G 7/12* (2006.01)

(52) U.S. Cl. ........................ 368/156; 327/175; 327/291

(58) Field of Classification Search .................. 368/10, 368/155–157; 327/172–176, 291, 299, 323; 331/74, 75, 175
See application file for complete search history.

(56) References Cited

U.S. PATENT DOCUMENTS

| 4,881,041 | A |   | 11/1989 | Kawanabe et al. |
| 4,959,557 | A | * | 9/1990  | Miller .......................... 327/175 |
| 5,057,702 | A |   | 10/1991 | Kitagawa et al. |
| 5,345,186 | A | * | 9/1994  | Lesmeister .................. 327/105 |
| 5,477,180 | A |   | 12/1995 | Chen |
| 5,907,254 | A |   | 5/1999  | Chang |
| 5,912,574 | A |   | 6/1999  | Bhagwan |
| 5,920,217 | A | * | 7/1999  | Mellot ......................... 327/175 |
| 6,028,491 | A | * | 2/2000  | Stanchak et al. ............. 331/75 |
| 6,320,438 | B1| * | 11/2001 | Arcus .......................... 327/175 |
| 6,509,771 | B1|   | 1/2003  | Atallah et al. |

FOREIGN PATENT DOCUMENTS

| DE | 38 16 973 A | 12/1988 |
| EP | 0 377 897 A2 | 7/1990 |

OTHER PUBLICATIONS

International Search Report (3 pages), dated Jun. 18, 2004.

* cited by examiner

*Primary Examiner*—Vit W Miska
(74) *Attorney, Agent, or Firm*—Finnegan, Henderson, Farabow, Garrett, & Dunner, LLP

(57) ABSTRACT

This clock generator comprises an oscillator for generating an alternating current pilot signal and a pulse formatting circuit which is intended to convert the pilot signal from the oscillator into a pulse clock signal having a duty factor of at least approximately 50%. According to one implementation, a series of at least two inverters is provided, the input of the first inverter being controlled by the alternating current pilot signal and the output of the second inverter supplying the clock signal. A power supply means may also be provided to supply the inverters with a regulated power supply voltage dependent on the signals appearing at the outputs of the inverters.

13 Claims, 1 Drawing Sheet

CLOCK GENERATOR

This application is a national stage filing under 35 U.S.C. § 371 of International Application No. PCT/CH2004/000121, filed on Mar. 3, 2004.

TECHNICAL FIELD

The present invention relates to a very low consumption pulse signal clock generator outputting, on the basis of an analog signal provided by a quartz oscillator, a pulse signal having a maximum swing and the duty factor of which is fixed as close as possible to 50%.

BACKGROUND ART

In certain clock-making applications, and in the case of electronic devices that do not operate permanently, but have to be activated from time to time, according to the current time, it is desirable to have a time reference, the energy consumption of which is as low as possible. This is especially the case for portable devices powered by an independent power source such as a battery.

In conventional time references, the output of the time base rarely provides a signal having a duty cycle corresponding to the exact symmetry of the pulse signal (duty cycle of 50%) and the voltage swing of which extends from one potential to the other of the power supply lines of the circuit (expressed as "rail to rail" swing). It is then necessary to mount a divider by two after the time base to accurately adjust the duty factor of the pulse signal.

In applications dedicated more specifically to radio communication and featuring the activation function mentioned above, two time references are conventionally used, namely a low energy reference based most commonly on a 32 kHz watchmaker's type quartz resonator to ensure synchronization on the current time and another very accurate time reference, the time base of which produces, at the cost of greater consumption, a high frequency, greater than 10 MHz for example, to create a narrowband communication channel for exchanging information with one or more other devices equipped with compatible transmission/reception equipment.

Such an arrangement with two time references leads to a greater complexity (controlling the starting of the high frequency oscillator) and entails the use of two bulky quartz resonators.

SUMMARY OF THE INVENTION

The object of the invention is to provide a clock generator combining low consumption with reduced footprint and complexity, while ensuring good symmetry of the pulse signal with a wide swing of the latter.

The subject of the invention is therefore a clock generator comprising an oscillator for generating an alternating current pilot signal and a pulse formatting circuit which is designed to convert the pilot signal from said oscillator into a pulse clock signal having a duty factor of approximately 50%, characterized in that it comprises:

- a series of at least a first and a second inverters, the input of the first inverter being controlled by said alternating current pilot signal and the output of the second inverter supplying said clock signal, and
- power supply means for supplying said inverters with a regulated power supply voltage according to signals appearing at the outputs of said inverters.

With these characteristics, the resulting clock signal presents a duty factor very close to 50% with a rail-to-rail pulse swing, and this with a simple circuit presenting a very low consumption.

According to other advantageous characteristics of the invention, said power supply means include a negative feedback control loop connected between the outputs of said inverters and a power supply line of the latter on which said regulated power supply voltage is established;

said negative feedback loop includes a control transistor, the source-drain path of which is linked to said power supply line, and the gate of which is driven by a differential amplifier of the output signals of said inverters;

said differential amplifier comprises:
- a differential pair of input transistors respectively driven by the output signals of said inverters;
- a first current mirror for biasing said input transistors,
- a second output current mirror connected to the gate of said control transistor and connected in series with said first current mirror,
- a first of said input transistors being inserted between first branches of said current mirrors by having its gate connected to the output of one of said inverters, the second of said input transistors being linked between the output of the other of said inverters and a rail raised to the power supply voltage of the generator, and
- the transformation ratio of said first current mirror being 1:2 towards the branch lacking said corresponding input transistor;

a third inverter is provided, connected between the output of said oscillator and said first inverter, said third inverter also being powered by said power supply means;

a current source is provided, designed to supply a starting current to one of said input transistors such that, when said generator is powered up, said regulated voltage presents a non-zero value.

BRIEF DESCRIPTION OF THE DRAWINGS

Other characteristics and advantages of the present invention will become apparent from reading the description that follows, given purely as an example and given with reference to the appended drawings in which.

DETAILED DESCRIPTION OF REFERRED EMBODIMENTS

Figure 1:
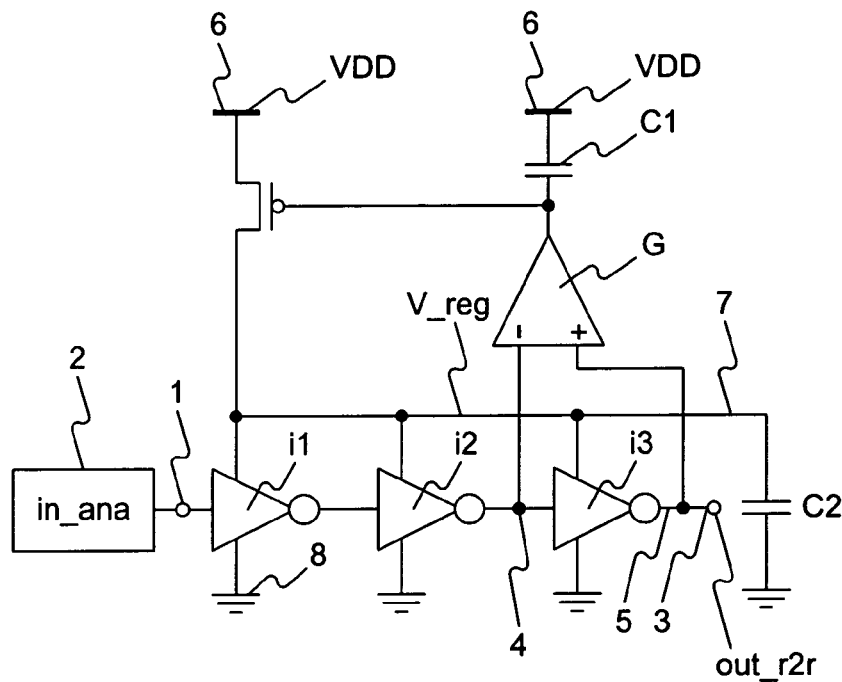
FIG. 1 is a functional diagram of the clock generator according to the invention.

The exemplary embodiment according to the invention functionally represented in FIG. 1 comprises a series of three inverters i1, i2 and i3 connected cascade-wise. The input 1 of the inverter i1 is linked to a quartz oscillator 2 supplying an alternating current pilot signal in_ana having the frequency of the clock signal that is desired at the output 3 of the generator (out_r2r signal). To give an idea, the frequency of the oscillator 2 can be approximately 10 MHz.

The node 4 situated between the inverters i2 and i3 is connected to the inverting input of a differential amplifier G and the node 5 between the output of the inverter i3 and the output of the generator is connected to the non-inverting input of this differential amplifier G. The output of the latter is linked to the gate of a p-type control transistor M and to a capacitor C1 connected to a power supply rail 6 to which is applied a power supply voltage $V_{DD}$.

The drain-source path of the transistor M is linked between this power supply rail 6 and a regulated power supply line 7 which serves the three inverters i1, i2 and i3, the power supply for the latter further being provided by a power supply rail 8 to which is applied a power supply voltage $V_{SS}$ which can be ground. The regulated power supply line 7 is further connected to a capacitor C2 linked moreover to this ground.

The alternating current pilot signal in_ana supplied by the quartz oscillator 2, or alternatively by any other oscillator known per se, is amplified by the inverters i1, i2 and i3, to a level such that the voltage swing extends between the potential of the power supply rail 6 and the ground potential (referred to below as "rail-to-rail" swing). The duty factor of the resulting signal out_r2r is approximately 50%. This result is obtained due to the fact that the transistor M and the differential amplifier G form a control loop providing a negative feedback to the outputs of the inverters i2 and i3, so controlling the voltage V_reg present on the regulated power supply line 7. This power supply voltage is controlled such that the voltages averaged at the outputs 4 and 5 of the inverters i2 and i3 are at least very close to equality. More specifically, the feedback loop formed by the amplifier G and the transistor M, the bandwidth of which is very low relative to the frequency of the pilot signal, forces the regulated voltage V_reg to converge towards the switching threshold of the three inverters i1, i2 and i3.

According to a variant of the invention, it is possible to dispense with the inverter i1, only the inverters i2 and i3 being indispensable.

Figure 2:
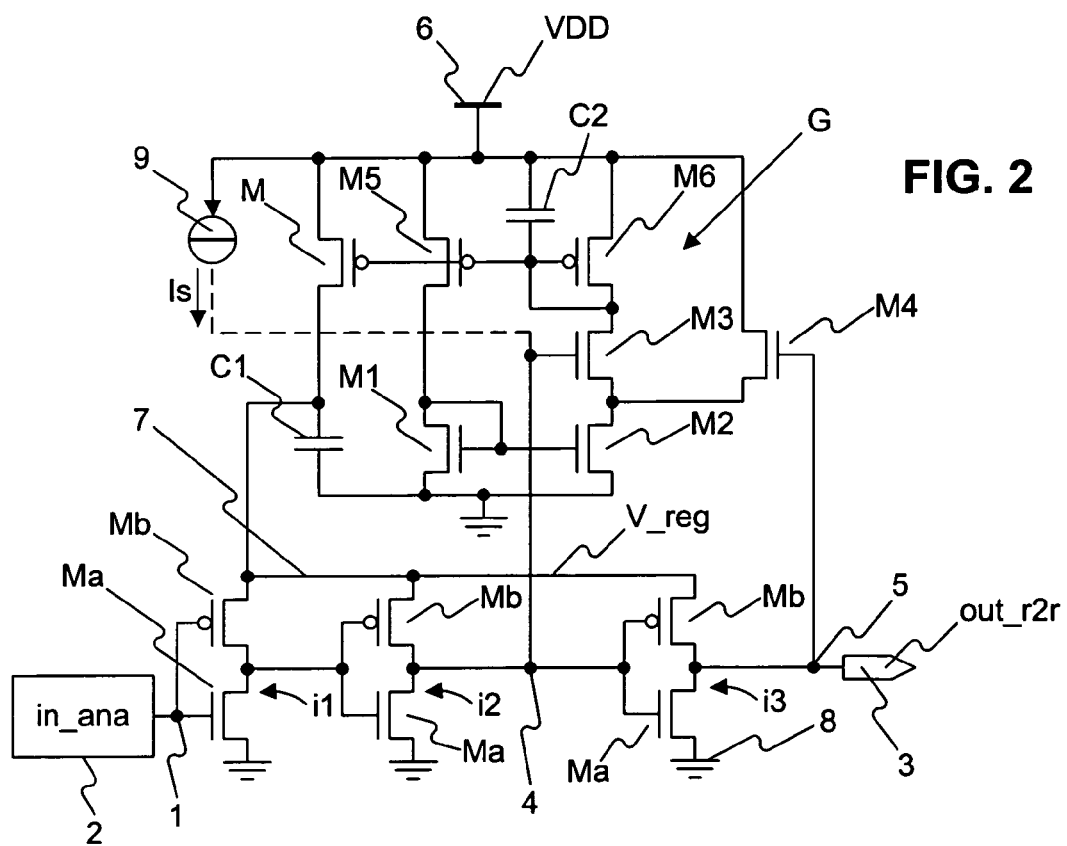
FIG. 2 is a detailed diagram of this clock generator.

FIG. 2 shows a detailed diagram of a preferred embodiment of the invention.

Each of the inverters i1, i2 and i3 is formed by an n-type transistor Ma, the source-drain path of which is connected in series with that of a p-type transistor Mb, the whole being connected between the regulated power supply line 7 and the ground 8. The input of each inverter is formed by the gates of these transistors Ma and Mb and the output is sampled on the common node between their source-drain paths. The amplifier G includes a first current mirror formed by n-type transistors M1 and M2. Two transistors M3 and M4, also of n-type, form a differential pair of input transistors, the gates of which are respectively linked to the nodes 4 and 5 forming the outputs of the inverters i2 and i3. A second current mirror is formed by p-type transistors M5 and M6. Their source-drain path is respectively linked in series with that of the transistors M1 and M2 between the power supply rail 6 and the ground. Moreover, the source-drain path of the transistor M3 is connected in the branch of these current mirrors including the transistors M2 and M6. This branch is also connected between the power supply rail 6 and the ground 8, whereas the source-drain path of the transistor M4 is directly linked between the power supply rail 6 and the node situated between the transistors M2 and M3. Operation is as follows.

The differential amplifier G is biased adaptively by the current mirror formed by the transistors M, M5 and M6. A fraction of the current consumed by the load of the amplifier (that is, the load imposed on the power supply line 7 of the inverters i1, i2 and i3 on the transistor M) thus biases the amplifier. The current flowing in the transistor M5, identical to that flowing through the transistor M6, is doubled by the current mirror formed by the transistors M1 and M2. The transistor M2 biases the differential pair of input transistors M3 and M4.

The positive feedback on this biasing increases or reduces the current flowing in the transistor M2, and consequently in the transistor M, until the same current flows in the transistors M3 and M4. This mode of operation is obtained provided that the transistors M1 and M2 form a current mirror of ratio 1:2 ensuring that the average voltages at the inputs 4 and 5 become equal, that is, that the duty factor of the output signal out_r2r becomes equal to 50% or at least as close as possible to this percentage. The capacitor C2 smoothes the current peaks that can possibly occur on the regulated power supply line 7.

To start up the assembly on power up, a current source 9 is provided, supplying a current Is which is then input to the gate of the transistor M3 to prevent the circuit from being biased at a stable operating point with the voltage V_reg=0 V. This current source 9 is automatically disconnected from the circuit when an appropriate logic (not shown) observes that the voltage V_reg becomes different from 0 V.

The circuit according to the invention provides a negative feedback loop, the bandwidth of which is significantly below the frequency of the alternating current pilot signal that the inverters i1, i2 and i3 are required to amplify. This feedback loop forces the regulated voltage V_reg to converge towards the switching threshold of the three inverters independently of the different offsets of the transistor threshold voltages. Now, the alternating current voltage at the input 1 can be low, while provoking the production by the series of inverters of a pulse "rail-to-rail" voltage, the duty factor of which is 50% when the control loop finds its stable operating point.

The output out_r2r obtained in this way can therefore be used directly as a symmetrical clock signal, without the need of a divider by two which would be required to ensure the symmetry of the output signal of a conventional clock generator.

Another advantage of the invention is the very low consumption that can be obtained by minimally rating the transistors Ma and Mb of the inverters i1, i2 and i3, and the transistors M1 and M2. Moreover, since the transistors M1 and M2 act as switches, an offset of their threshold voltage (value inversely proportional to the square root of the area occupied by the transistor) has no effect on the symmetry of the output signal out_r2r. The offsets of the transistors forming the inverters, even if they are high, are compensated by the negative feedback of the control loop.

The consumption of the circuit comprises an alternating current part (the switching of the three inverters) and a direct current part dependent on the direct current voltage component of the input signal in_ana and on the amplitude of its alternating current component. More specifically, the higher this amplitude, the more the direct current part of the consumption of the first inverter i1 is reduced.

In a physical exemplary embodiment in 0.18 μm CMOS technology, the alternating current consumption, with a frequency of the output signal out_r2r of 12.8 MHz, is approximately 40 nA, while the direct current consumption is less than 100 nA.

The low consumption of the circuit according to the invention can be important, particularly in applications in which a function needs to be executed only for periods of use spaced apart in time and preset, outside of which the corresponding device is on standby. In these conditions, this device must have a permanent time base to activate it. This time base can be formed by the circuit of the invention, the output signal of which can easily be divided by a conventional division circuit to obtain the real time clock. However, the circuit of the invention can then also be used outside the periods on standby to produce a stable frequency standard with an accurate duty factor, for example to clock a microprocessor at the frequency of the crystal of the oscillator 2, or to create a radio communication channel.

It will also be noted that the clock generator of the invention offers good rejection of the variations of the power supply voltage applied between the rail 6 and ground 8, which can be important, especially if a device including the generator is powered by an independent power source such as a battery.

What is claimed is:

1. A clock generator comprising an oscillator for generating an alternating current pilot signal (in_ana) and a pulse formatting circuit which is intended to convert said current pilot signal from said oscillator into a pulse clock signal (out_r2r) having a duty factor of approximately 50%, said clock generator further comprising:
   a series of at least a first and a second inverters, said first inverter having an input controlled by said alternating current pilot signal (in_ana) and said second inverter having an output supplying said clock signal (out_r2r), and
   power supply means for supplying said inverters with a regulated power supply voltage (V_reg) according to signals appearing at an output of said first inverter and at said output of said second inverter.

2. The clock generator according to claim 1, wherein said power supply means include a negative feedback control loop connected between said outputs of said inverters and a power supply line of the latter on which said regulated power supply voltage (V_reg) is established.

3. The clock generator according to claim 2, wherein said negative feedback loop includes a control transistor the source-drain path of which is linked to said power supply line and the gate of which is driven by a differential amplifier of said output signals of said inverters.

4. The clock generator according to claim 3, wherein said differential amplifier comprises:
   a differential pair of input transistors respectively driven by said output signals of said inverters
   a first current mirror for biasing said input transistors,
   a second output current mirror connected to said gate of said control transistor and connected in series with said first current mirror,
   a first of said input transistors being inserted between first branches of said current mirrors by having its gate connected to said output of one of said inverters, the second of said input transistors being linked between said output of the other of said inverters and a rail raised to power supply voltage ($V_{DD}$) of the clock generator, and
   said first current mirror presenting a transformation ratio of 1:2 towards its branch lacking said corresponding input transistor.

5. The clock generator according to claim 1, wherein a third inverter is provided, connected between an output of said oscillator and said first inverter, said third inverter also being powered by said power supply means.

6. The clock generator according to claim 2, wherein a third inverter is provided, connected between an output of said oscillator and said first inverter, said third inverter also being powered by said power supply means.

7. The clock generator according to claim 3, wherein a third inverter is provided, connected between an output of said oscillator and said first inverter, said third inverter also being powered by said power supply means.

8. The clock generator according to claim 4, wherein a third inverter is provided, connected between an output of said oscillator and said first inverter, said third inverter also being powered by said power supply means.

9. The clock generator according to claim 4, wherein a current source is provided for supplying a starting current to one of said input transistors such that, when said generator is powered up, said regulated voltage (V_reg) presents a non-zero value.

10. The clock generator according to claim 5, wherein a current source is provided for supplying a starting current to one of said input transistors such that, when said generator is powered up, said regulated voltage (V_reg) presents a non-zero value.

11. The clock generator according to claim 6, wherein a current source is provided for supplying a starting current to one of said input transistors such that, when said generator is powered up, said regulated voltage (V_reg) presents a non-zero value.

12. The clock generator according to claim 7, wherein a current source is provided for supplying a starting current to one of said input transistors such that, when said generator is powered up, said regulated voltage (V_reg) presents a non-zero value.

13. The clock generator according to claim 8, wherein a current source is provided for supplying a starting current to one of said input transistors such that, when said generator is powered up, said regulated voltage (V_reg) presents a non-zero value.

* * * * *